United States Patent
Nishiyama et al.

(10) Patent No.: US 10,656,524 B2
(45) Date of Patent: May 19, 2020

(54) SUBSTRATE PROCESSING APPARATUS INCLUDING TRANSPORT DEVICE

(71) Applicant: SCREEN HOLDINGS CO., LTD., Kyoto (JP)

(72) Inventors: Koji Nishiyama, Kyoto (JP); Kazuhiro Inoue, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 246 days.

(21) Appl. No.: 15/661,691

(22) Filed: Jul. 27, 2017

(65) Prior Publication Data

US 2018/0052393 A1    Feb. 22, 2018

(30) Foreign Application Priority Data

Aug. 18, 2016 (JP) .................... 2016-160307

(51) Int. Cl.
  *B05C 9/14*    (2006.01)
  *G03F 7/20*    (2006.01)
  (Continued)

(52) U.S. Cl.
  CPC .......... *G03F 7/16* (2013.01); *B05C 9/14* (2013.01); *B05C 13/02* (2013.01); *G03F 7/20* (2013.01);
  (Continued)

(58) Field of Classification Search
  None
  See application file for complete search history.

(56) References Cited

U.S. PATENT DOCUMENTS 6,466,300 B1   10/2002 Deguchi .................... 355/27
2003/0147643 A1*  8/2003 Miyata ................ G03F 7/7075
                                                                  396/564
(Continued)

FOREIGN PATENT DOCUMENTS

JP    2000-269304 A    9/2000
JP    2003-224175 A    8/2003
(Continued)

OTHER PUBLICATIONS

Office Action dated Nov. 19, 2018 in counterpart Korean Patent Application No. 10-2017-0103536.
(Continued)

*Primary Examiner* — Binu Thomas
(74) *Attorney, Agent, or Firm* — Ostrolenk Faber LLP

(57) ABSTRACT

A substrate on which exposure processing has not been performed is carried into a placement cooling unit and cooled. The cooled substrate is held and carried out from the placement cooling unit by a transport device. In the case where an exposure device is able to receive the substrate, the substrate that has been carried out from the placement cooling unit is transported to the exposure device by the transport device. In the case where the exposure device is unable to receive the substrate, the substrate that has been carried out from the platform cooling unit is carried into a cooling buffer unit by the transport device. In the cooling buffer unit, a temperature of the substrate is maintained. After the exposure device becomes able to receive the substrate, the substrate is carried out from the cooling buffer unit and transported to the exposure device by the transport device.

8 Claims, 10 Drawing Sheets

(51) Int. Cl.
*H01L 21/67* (2006.01)
*H01L 21/677* (2006.01)
*G03F 7/16* (2006.01)
*B05C 13/02* (2006.01)

(52) U.S. Cl.
CPC ........ *G03F 7/7075* (2013.01); *H01L 21/6715* (2013.01); *H01L 21/67109* (2013.01); *H01L 21/67178* (2013.01); *H01L 21/67276* (2013.01); *H01L 21/67745* (2013.01)

(56) References Cited

U.S. PATENT DOCUMENTS

| | | | |
|---|---|---|---|
| 2005/0061248 A1* | 3/2005 | Koyama | H01L 21/67178 118/719 |
| 2008/0125899 A1 | 5/2008 | Numakura | 700/112 |
| 2010/0236587 A1 | 9/2010 | Hamada et al. | 134/133 |
| 2012/0145074 A1* | 6/2012 | Fukutomi | H01L 21/6715 118/58 |
| 2014/0106281 A1 | 4/2014 | Hamada et al. | 430/325 |
| 2014/0285790 A1* | 9/2014 | Nishiyama | H01L 21/67178 355/72 |
| 2019/0019698 A1 | 1/2019 | Nishiyama | |

FOREIGN PATENT DOCUMENTS

| | | |
|---|---|---|
| JP | 2005-101028 A | 4/2005 |
| JP | 2008-135517 A | 6/2008 |
| JP | 2010-045214 A | 2/2010 |
| JP | 2010-219434 A | 9/2010 |
| JP | 5462506 B2 | 4/2014 |
| JP | 2014-187273 A | 10/2014 |
| KR | 10-0919084 B1 | 9/2009 |

OTHER PUBLICATIONS

Office Action dated Nov. 5, 2019 in counterpart Japanese Patent Application No. 2016-160307.

* cited by examiner

SUBSTRATE PROCESSING APPARATUS INCLUDING TRANSPORT DEVICE

BACKGROUND OF THE INVENTION

Field of the Invention

The present invention relates to a substrate processing apparatus and a substrate processing method for performing processing on a substrate.

Description of Related Art

In a lithography process in the manufacture of a semiconductor device and the like, a coating liquid such as a resist liquid is supplied onto a substrate, so that a coating film is formed. The coating film is exposed and then developed, so that a predetermined pattern is formed on the coating film. In JP 2010-219434 A, a substrate processing apparatus arranged to be adjacent to an exposure device is described.

The substrate processing apparatus described in JP 2010-219434 A includes a processing block in which the coating film is formed on the substrate and the development is performed on the substrate, and an interface block in which the substrate is cooled to a temperature suitable for the exposure. Further, the interface block is provided with a transport device that transports the substrate on which the coating film is formed from the processing block to the exposure device for the exposure and transports the exposed substrate from the exposure device to the processing block for the development.

BRIEF SUMMARY OF THE INVENTION

In order to improve efficiency of processing for the substrate, a time period required for processing by the exposure device is sometimes estimated, and the transport device of the substrate processing apparatus is sometimes controlled to perform a preceding operation based on the estimated time period. In such a preceding operation, when the processing for the substrate that has been carried into the exposure device is started, the transport device immediately carries in the next substrate to the exposure device.

However, an operation of the exposure device is sometimes temporarily stopped. Further, the substrate sometimes remains in the exposure device. In this case, it is necessary to wait for the substrate to be carried into the exposure device from the substrate processing apparatus. Thus, efficiency of processing for the substrate in the substrate processing apparatus is reduced. Further, although the temperature of the substrate is optimized for the exposure processing, the temperature of the substrate changes by the time when the substrate is carried into the exposure device, and the substrate cannot be appropriately processed.

An object of the present invention is to provide a substrate processing apparatus in which a substrate in an appropriate state can be carried into an exposure device while a reduction in efficiency of processing for the substrate is inhibited according to a state of the exposure device, and a substrate processing method for enabling the substrate in the appropriate state to be carried into the exposure state while a reduction in efficiency of processing for the substrate is inhibited according to the state of the exposure device.

(1) A substrate processing apparatus according to one aspect of the present invention that is arranged to be adjacent to an exposure device includes a processing section including a coating device that applies a photosensitive material on a substrate and forms a photosensitive film, a receiving transferring section for receiving and transferring the substrate between the processing section and the exposure device, and a substrate transport controller that controls transport of the substrate, wherein the receiving transferring section includes first and second transport devices that hold and transport the substrates, a placement cooler configured such that the substrate can be placed on the placement cooler, the placement cooler being for cooling the placed substrate, and a temperature maintainer configured such that the substrate can be placed on the temperature maintainer, the temperature maintainer being for maintaining a temperature of the placed substrate, the substrate transport controller controls the first transport device such that the substrate is carried into the placement cooler from the processing section, controls the second transport device such that the substrate placed on the placement cooler is carried out, in the case where the exposure device is able to receive the substrate, controls the second transport device such that the substrate that has been carried out from the placement cooler is transported to the exposure device, in the case where the exposure device is unable to receive the substrate, controls the second transport device such that the substrate that has been carried out from the placement cooler is carried into the temperature maintainer, and after it is determined that the exposure device is able to receive the substrate, controls the second transport device such that the substrate is carried out from the temperature maintainer and transported to the exposure device.

In this substrate processing apparatus, the photosensitive material is applied onto the substrate by the coating device in the processing section, and the photosensitive film is formed. The substrate that has come from the processing section is held in the receiving transferring section and carried into the placement cooler by the first transport device. The substrate that has been carried in by the first transport device is cooled by the placement cooler. The cooled substrate is held and carried out from the placement cooler by the second transport device. In the case where the exposure device is able to receive the substrate, the substrate that has been carried out from the placement cooler is transported to the exposure device by the second transport device. In the case where the exposure device is unable to receive the substrate, the substrate that has been carried out from the placement cooler is carried into the temperature maintainer by the second transport device. The temperature of the substrate that has been carried in by the second transport device is maintained by the temperature maintainer. After the exposure device becomes able to receive the substrate, the substrate is carried out from the temperature maintainer and transported to the exposure device by the second transport device.

In this configuration, even in the case where the operation of the exposure device is temporarily stopped or the case where the substrate remains in the exposure device, the substrate is placed on the temperature maintainer until the exposure device becomes able to receive the substrate. Therefore, it is not necessary for the second transport device to continue holding the substrate to be transported to the exposure device. Thus, the second transport device can continue transporting another substrate in the receiving transferring section. Further, the temperature of the substrate placed on the temperature maintainer is maintained. Therefore, after the exposure device becomes able to receive the substrate, the substrate having a predetermined temperature can be immediately transported to the exposure device. As a result, the substrate in an appropriate state can be carried into the exposure device while a reduction in efficiency of processing for the substrate is inhibited according to a state of the exposure device.

(2) The substrate transport controller may include a first transport controller that controls the first transport device such that the substrate is transported from the processing section to the placement cooler, a second transport controller that controls the second transport device such that the substrate placed on the placement cooler is carried out, a determiner that determines whether the exposure device is able to receive the substrate, a third transport controller that, in the case where it is determined that the exposure device is able to receive the substrate, controls the second transport device such that the substrate that has been carried out from the placement cooler is transported to the exposure device, and a fourth transport controller that, in the case where it is determined that the exposure device is unable to receive the substrate, controls the second transport device such that the substrate that has been carried out from the placement cooler is carried into the temperature maintainer, and after it is determined that the exposure device is able to receive the substrate, controls the second transport device such that the substrate is carried out from the temperature maintainer and transported to the exposure device. In this case, the second transport controller can be easily controlled.

(3) The receiving transferring section may include a plurality of the placement coolers, and the substrate transport controller may control the first and second transport devices such that part of the plurality of the placement coolers functions as the temperature maintainer. In this case, the temperature maintainer can be realized by the same configuration as the configuration of the placement cooler. Thus, a manufacturing cost of the temperature maintainer can be reduced.

(4) The substrate transport controller may control the first and second transport devices such that the part of the plurality of placement coolers that functions as the temperature maintainer is sequentially changed. In this case, marked deterioration of only part of the placement cooler over time can be prevented.

(5) The receiving transferring section may further include a buffer for temporarily storing the substrate, and the substrate transport controller may further control the first transport device such that, in the case where the placement cooler is unable to receive the substrate, the substrate that has been processed in the processing section is transported to the buffer, and may further control the first transport device such that, after the placement cooler becomes able to receive the substrate, the substrate stored in the buffer is transported to the placement cooler.

In this case, it is not necessary for the first transport device to continue holding the substrate to be transported to the placement cooler. Thus, the first transport device can continue transporting another substrate in the receiving transferring section. Further, after the placement cooler becomes able to receive the substrate, the first transport device can immediately transport the substrate placed on the buffer to the placement cooler. As a result, a reduction in efficiency of processing can be more sufficiently inhibited.

(6) The receiving transferring section may further include a returning platform on which the substrate can be placed, and the substrate transport controller may further control the first transport device such that the exposed substrate that is placed on the returning platform is carried out and transported, and may further control the second transport device such that the exposed substrate is carried out from the exposure device and transported to the returning platform. In this case, the exposed substrate can be carried out and easily taken out from the returning platform.

(7) The first transport device may have first and second holders for holding the substrates, and the substrate transport controller may control the first and second holders of the first transport device such that carrying of the substrate out from the returning platform and carrying of the substrate into the placement cooler are performed continuously or concurrently.

In this case, carrying of the substrate out from the returning platform and carrying of the substrate into the placement cooler are performed continuously or concurrently, so that efficiency of transport of the first transport device is improved. Thus, the efficiency of processing for the substrate can be improved.

(8) The second transport device may have third and fourth holders for holding the substrates, and the substrate transport controller may control the third and fourth holders of the second transport device such that carrying of the substrate out from the exposure device and carrying of the substrate into the exposure device are performed continuously or concurrently.

In this case, carrying of the substrate out from the exposure device and carrying of the substrate into the exposure device are performed continuously or concurrently, so that the efficiency of transport of the second transport device is improved. Thus, the efficiency of processing for the substrate can be improved.

(9) The second transport device may have fifth and sixth holders for holding the substrates, and the substrate transport controller may further control the fifth and sixth holders of the second transport device such that carrying of the substrate out from the placement cooler and carrying of the substrate into the returning platform are performed continuously or concurrently.

In this case, carrying of the substrate out from the placement cooler and carrying of the substrate into the returning platform are performed continuously or concurrently, so that the efficiency of transport of the second transport device is improved. Thus, the efficiency of processing for the substrate can be improved.

(10) A substrate processing method according to another aspect of the present invention for performing processing on a substrate with use of a substrate processing apparatus arranged to be adjacent to an exposure device includes the steps of applying a photosensitive material onto the substrate by a coating device in a processing section and forming a photosensitive film, holding and carrying in the substrate from the processing section to a placement cooler by a first transport device in a receiving transferring section, cooling the substrate, which has been carried in by the first transport device, by the placement cooler, holding and carrying out the cooled substrate from the placement cooler by a second transport device, in the case where the exposure device is able to receive the substrate, transporting the substrate that has been carried out from the placement cooler to the exposure device by the second transport device, in the case where the exposure device is unable to receive the substrate, carrying in the substrate that has been carried out from the placement cooler to a temperature maintainer by the second transport device, maintaining a temperature of the substrate, which has been carried in by the second transport device, by the temperature maintainer, and after the exposure device becomes able to receive the substrate, carrying out the substrate from the temperature maintainer and transporting the substrate to the exposure device by the second transport device.

According to this substrate processing method, the photosensitive material is applied onto the substrate by the coating device in the processing section, and the photosensitive film is formed. The substrate that has come from the processing section is held in the receiving transferring section and carried into the placement cooler by the first transport device. The substrate that has been carried in by the first transport device is cooled by the placement cooler. The cooled substrate is held and carried out from the placement cooler by the second transport device. In the case where the exposure device is able to receive the substrate, the substrate that has been carried out from the placement cooler is transported to the exposure device by the second transport device. In the case where the exposure device is unable to receive the substrate, the substrate that has been carried out from the placement cooler is carried into the temperature maintainer by the second transport device. The temperature of the substrate that has been carried in by the second transport device is maintained by the temperature maintainer. After the exposure device becomes able to receive the substrate, the substrate is carried out from the temperature maintainer and transported to the exposure device by the second transport device.

In this configuration, even in the case where the operation of the exposure device is temporarily stopped or the case where the substrate remains in the exposure device, the substrate is placed on the temperature maintainer until the exposure device becomes able to receive the substrate. Therefore, it is not necessary for the second transport device to continue holding the substrate to be transported to the exposure device. Thus, the second transport device can continue transporting another substrate in the receiving transferring section. Further, the temperature of the substrate placed on the temperature maintainer is maintained. Therefore, after the exposure device becomes able to receive the substrate, the substrate having a predetermined temperature can be immediately transported to the exposure device. As a result, the substrate in an appropriate state can be carried into the exposure device while a reduction in efficiently of processing for the substrate is inhibited according to the state of the exposure device.

Other features, elements, characteristics, and advantages of the present invention will become more apparent from the following description of preferred embodiments of the present invention with reference to the attached drawings.

DESCRIPTION OF THE PREFERRED EMBODIMENTS

A substrate processing apparatus and a substrate processing method according to one embodiment of the present invention will be described below with reference to drawings. In the following description, a substrate refers to a semiconductor substrate, a substrate for a liquid crystal display device, a substrate for a plasma display, a substrate for an optical disc, a substrate for a magnetic disc, a substrate for a magneto-optical disc, a substrate for a photomask or the like.

(1) Configuration of Substrate Processing Apparatus

Figure 1:
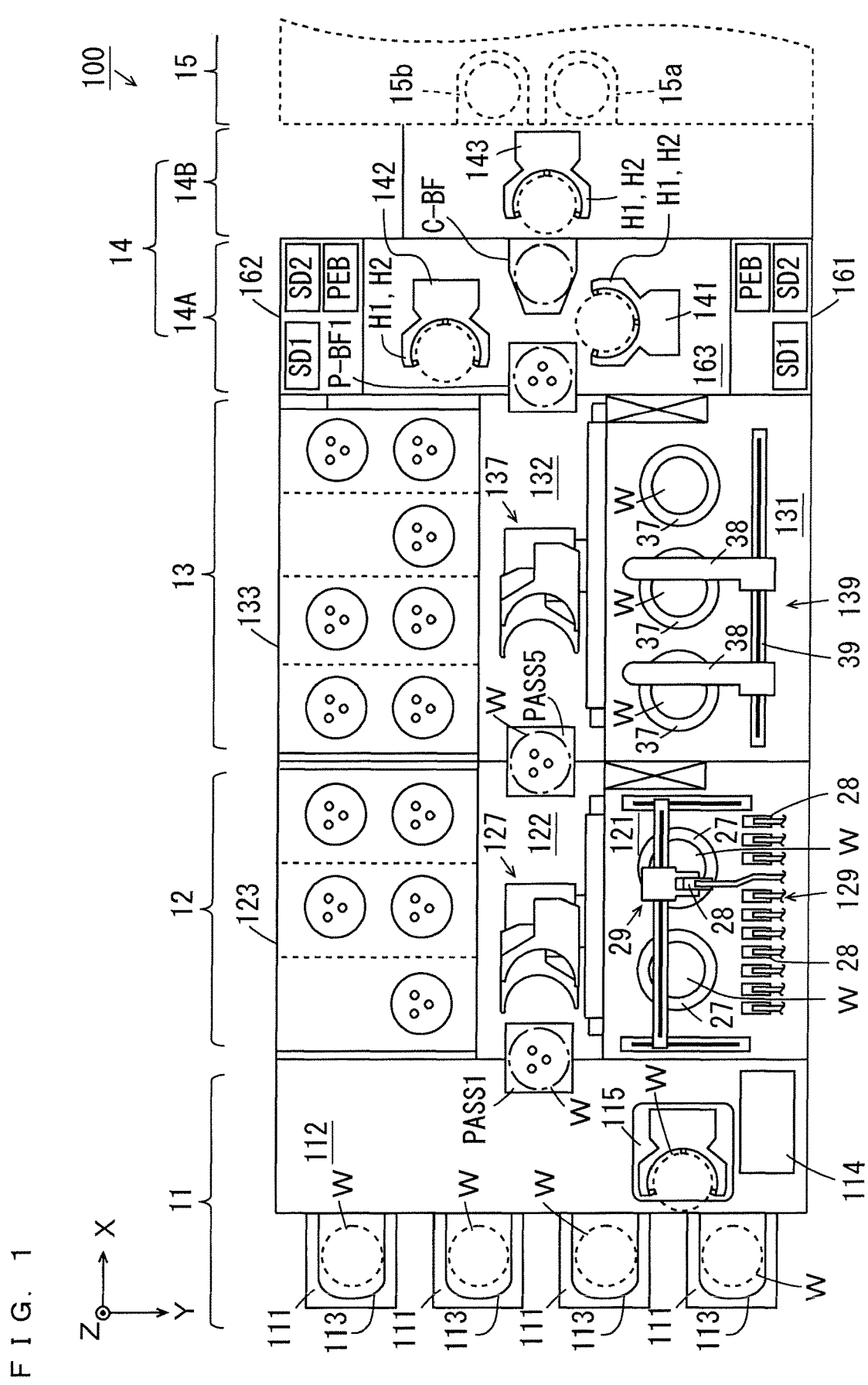
FIG. 1 is a schematic plan view of a substrate processing apparatus according to one embodiment of the present invention.

FIG. 1 is a schematic plan view of the substrate processing apparatus according to one embodiment of the present invention. FIG. 1 and the subsequent drawings are accompanied by the arrows that indicate X, Y and Z directions orthogonal to one another for the clarity of a positional relationship. The X and Y directions are orthogonal to each other within a horizontal plane, and the Z direction corresponds to a vertical direction.

As shown in FIG. 1, the substrate processing apparatus 100 includes an indexer block 11, a coating block 12, a development block 13, a cleaning drying processing block 14A and a carry-in carry-out block 14B. An interface block 14 is constituted by the cleaning drying processing block 14A and the carry-in carry-out block 14B. An exposure device 15 is arranged to be adjacent to the carry-in carry-out block 14B.

The indexer block 11 includes a plurality of carrier platforms 111 and a transport section 112. In each carrier platform 111, a carrier 113 for storing a plurality of substrates W in multiple stages is placed. In the transport section 112, a main controller 114 and a transport device 115 are provided. The main controller 114 controls various constituent elements of the substrate processing apparatus 100. The transport device 115 transports the substrate W while holding the substrate W.

The coating block 12 includes a coating processing section 121, a transport section 122 and a thermal processing section 123. The coating processing section 121 and the thermal processing section 123 are provided to be opposite to each other with the transport section 122 sandwiched therebetween. Substrate platforms PASS1 to PASS4 (FIG. 4) on which the substrates W are placed are provided between the transport section 122 and the indexer block 11. Transport devices 127, 128 (FIG. 4) that transport the substrates W are provided in the transport section 122.

The development block 13 includes a development processing section 131, a transport section 132 and a thermal processing section 133. The development processing section 131 and the thermal processing section 133 are provided to be opposite to each other with the transport section 132 sandwiched therebetween. Substrate platforms PASS5 to PASS8 (FIG. 4) on which the substrates W are placed are provided between the transport section 132 and the transport section 122. Transport devices 137, 138 (FIG. 4) that transport the substrates W are provided in the transport section 132.

The cleaning drying processing block 14A includes cleaning drying processing sections 161, 162 and a transport section 163. The cleaning drying processing sections 161, 162 are provided to be opposite to each other with the transport section 163 sandwiched therebetween. Transport devices 141, 142 are provided in the transport section 163.

Placement buffer units P-BF1, P-BF2 (FIG. 4) are provided between the transport section 163 and the transport section 132. The placement buffer units P-BF1, P-BF2 are configured such that the plurality of substrates W can be stored therein. Further, substrate platforms PASS9, PASS10 (FIG. 4) on which the substrates W are placed are provided between the transport section 163 and the transport section 132.

A cooling buffer unit C-BF is provided between the transport devices 141, 142 to be adjacent to the carry-in carry-out block 14B. Further, substrate platform PASS11 and a plurality of placement cooling units P-CP (FIG. 4), described below, are provided to be stacked on the cooling buffer unit C-BF. Further, a returning buffer unit RBF1 and a sending buffer unit SBF1 (FIG. 4) are provided above the cooling buffer unit C-BF, and a returning buffer unit RBF2 and a sending buffer unit SBF2 (FIG. 4) are provided below the cooling buffer unit C-BF.

The cooling buffer unit C-BF includes a function of cooling the substrate W, and is configured such that the substrate W can be temporarily stored therein. The substrate platform PASS11 is configured such that the substrate W can be placed thereon. Each placement cooling unit P-CP includes a function of cooling the substrate W (a cooling plate, for example). In the placement cooling unit P-CP, the substrate W is cooled to a temperature suitable for the exposure processing. The returning buffer units RBF1, RBF2 and the sending buffer units SBF1, SBF2 are configured such that the substrates W can be temporarily stored therein.

A transport device 143 is provided in the carry-in carry-out block 14B. The transport device 143 carries the substrate W into and carries out the substrate W from the exposure device 15. In the exposure device 15, a substrate inlet 15a for carrying in the substrate W and a substrate outlet 15b for carrying out the substrate W are provided.

(2) Coating Processing Section and Development Processing Section

Figure 2:
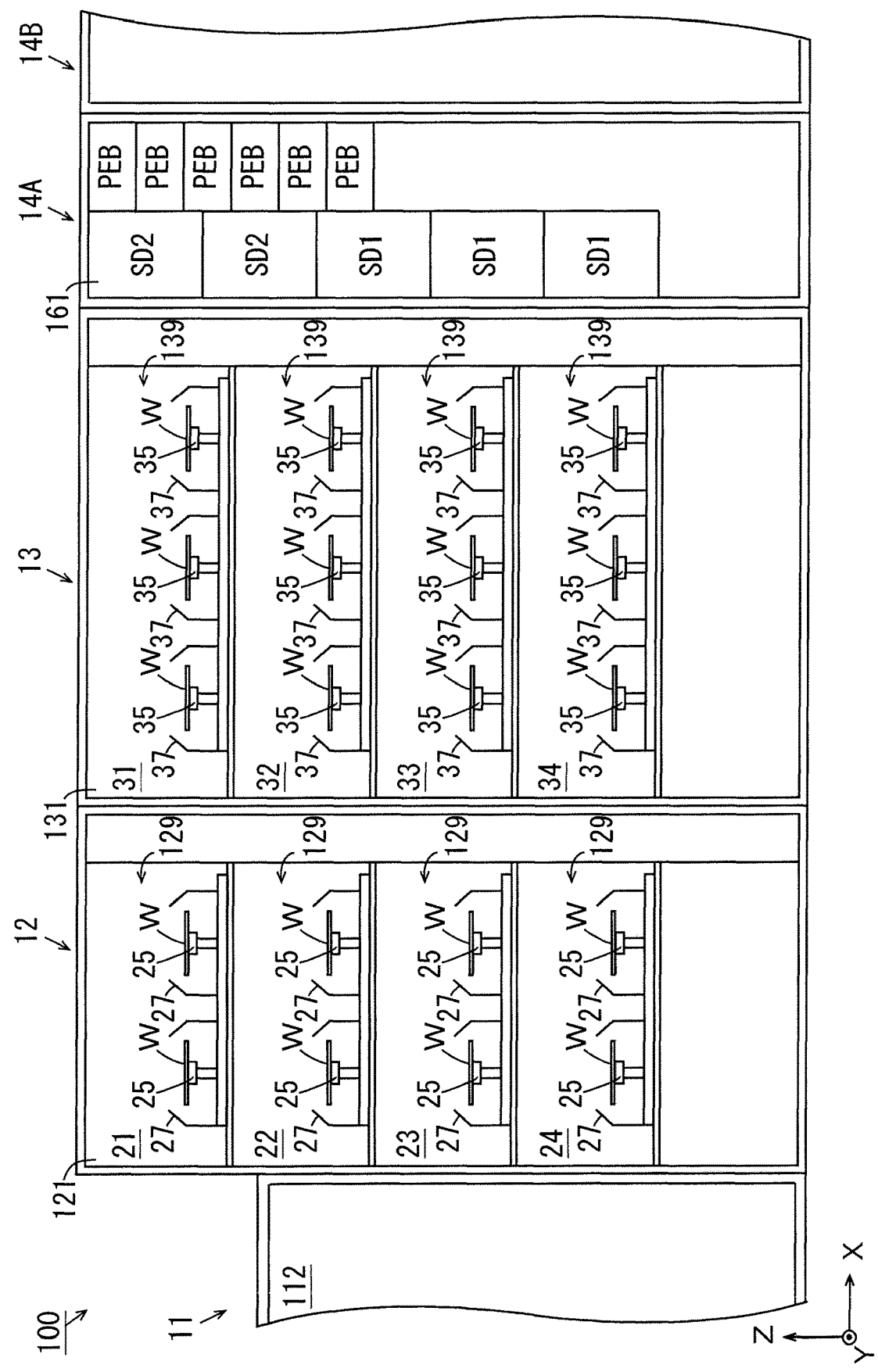
FIG. 2 is a schematic side view showing inner configurations of a coating processing section, a development processing section and a cleaning drying processing section of FIG. 1.

FIG. 2 is a schematic side view showing an inner configuration of the coating processing section 121, the development processing section 131 and the cleaning drying processing section 161 of FIG. 1. As shown in FIG. 2, the coating processing section 121 has coating processing chambers 21, 22, 23, 24 provided in a stack. Each of the coating processing chambers 21 to 24 is provided with a coating processing unit (a spin coating device) 129. The development processing section 131 has development processing chambers 31, 32, 33, 34 provided in a stack. Each of the development processing chambers 31, 32, 33, 34 is provided with a development processing unit (a spin developer) 139.

Each coating processing unit 129 includes spin chucks 25 for holding the substrates W and cups 27 provided to cover the surroundings of the spin chucks 25. In the present embodiment, each coating processing unit 129 is provided with two pairs of the spin chuck 25 and the cup 27. Each spin chuck 25 is driven to be rotated by a driving device (an electric motor, for example) that is not shown. Further, as shown in FIG. 1, each coating processing unit 129 includes a plurality of processing liquid nozzles 28 for discharging a processing liquid and a nozzle transport mechanism 29 for transporting the processing liquid nozzles 28.

In the coating processing unit 129, each spin chuck 25 is rotated by the driving device (not shown), and any processing liquid nozzle 28 among the plurality of processing liquid nozzles 28 is moved to a position above the substrate W by the nozzle transport mechanism 29, and a processing liquid is discharged from the processing liquid nozzle 28. Thus, the processing liquid is applied onto the substrate W. Further, a rinse liquid is discharged to a peripheral portion of the substrate W from an edge rinse nozzle (not shown). Thus, the processing liquid adhering to the peripheral portion of the substrate W is removed.

In the coating processing unit 129 in each of the coating processing chambers 22, 24, a processing liquid for an anti-reflection film is supplied to each substrate W from each processing liquid nozzle 28. In the coating processing unit 129 in each of the coating processing chambers 21, 23, a processing liquid for a resist film is supplied to each substrate W from each processing liquid nozzle 28.

Similarly to the coating processing unit 129, each development processing unit 139 includes spin chucks 35 and cups 37. Further, as shown in FIG. 1, the development processing unit 139 includes two development nozzles 38 for discharging a development liquid and a moving mechanism 39 for moving the development nozzles 38 in the X direction.

In the development processing unit 139, each spin chuck 35 is rotated by a driving device (not shown), and one development nozzle 38 supplies the development liquid to each substrate W while being moved in the X direction. Thereafter, the other development nozzle 38 supplies the development liquid to each substrate W while being moved. In this case, development processing for the substrate W is performed by the supply of the development liquid to the substrate W. Further, in the present embodiment, development liquids different from each other are respectively discharged from the two development nozzles 38. Thus, two types of the development liquids can be supplied to each substrate W.

The cleaning drying processing section 161 is provided to correspond to the transport device 141 of FIG. 1. In the cleaning drying processing section 161, a plurality (three in the present example) of cleaning drying processing units SD1 and a plurality (two in the present example) of cleaning drying processing units SD2 are provided to be adjacent to the development block 13 and in a stack. The plurality of cleaning drying processing units SD2 are arranged above the plurality of cleaning drying processing units SD1.

Further, in the cleaning drying processing section 161, a plurality (six in the present example) of post-exposure heating processing units PEB are provided to be adjacent to the carry-in carry-out block 14B and in a stack. The plurality of post-exposure heating processing units PEB are arranged in an upper portion of the cleaning drying processing section 161.

In each cleaning drying processing unit SD1, cleaning and drying processing for the substrate W on which the exposure processing has not been performed are performed. In each cleaning drying processing unit SD2, the cleaning and drying processing for the substrate W on which the exposure processing has been performed are performed. In each post-exposure heating processing unit PEB, post-exposure bake processing is performed.

(3) Thermal Processing Sections

Figure 3:
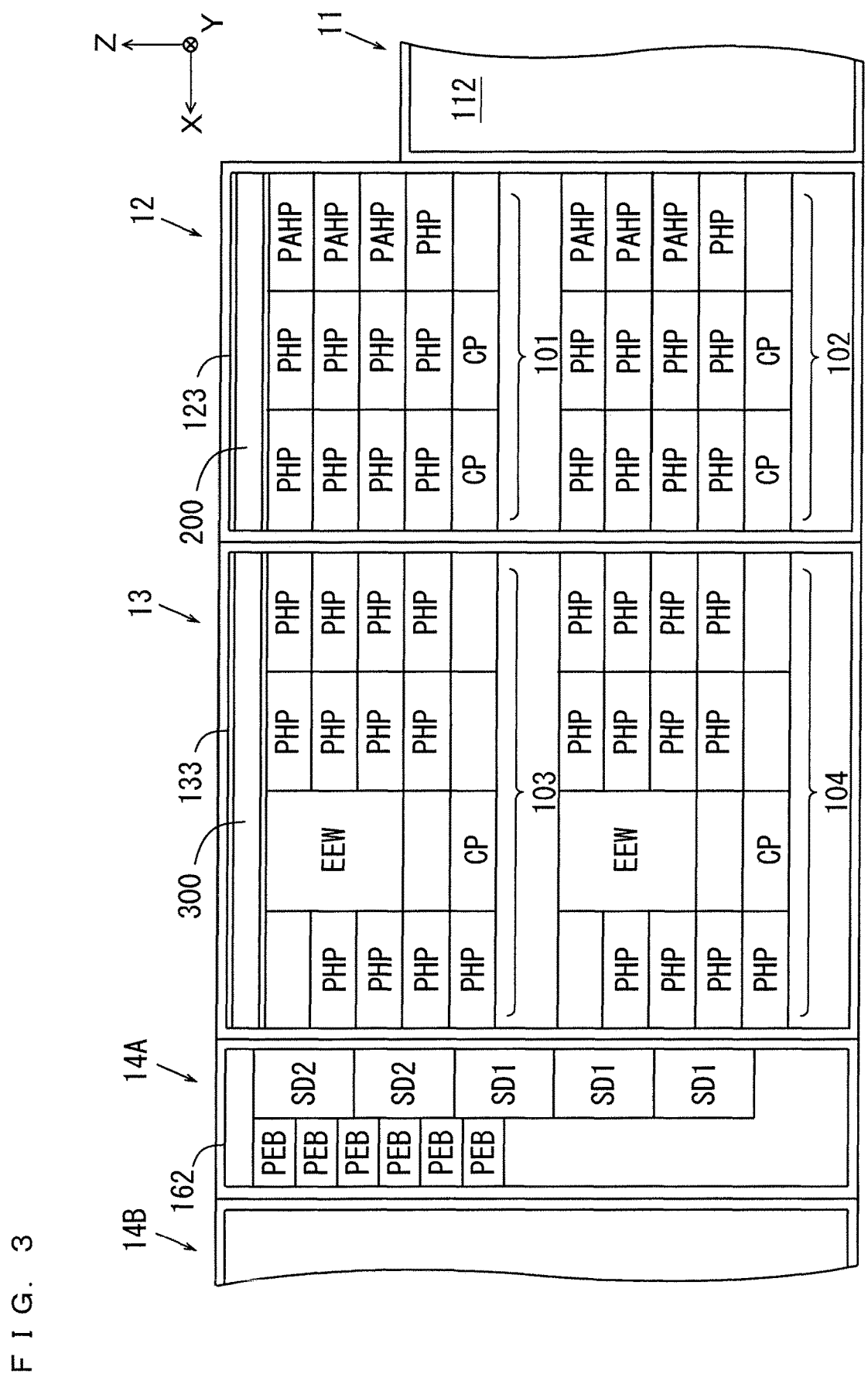
FIG. 3 is a schematic side view showing inner configurations of thermal processing sections and the cleaning drying processing section of FIG. 1.

FIG. 3 is a schematic side view showing inner configurations of the thermal processing sections 123, 133 and the cleaning drying processing section 162 of FIG. 1. As shown in FIG. 3, the thermal processing section 123 has an upper thermal processing section 101 provided above and a lower thermal processing section 102 provided below. A plurality of thermal processing units PHP, a plurality of adhesion reinforcement processing units PAHP and a plurality of cooling units CP are provided in each of the upper thermal processing section 101 and the lower thermal processing section 102.

A local controller 200 is provided in a top portion of the thermal processing section 123. The local controller 200 controls operations of the coating processing section 121, the transport section 122 and the thermal processing section 123 based on an instruction from the main controller 114 of FIG. 1.

Heating processing and cooling processing for the substrate W are performed in each thermal processing unit PHP. Adhesion reinforcement processing for improving adhesion between the substrate W and the anti-reflection film is performed in each adhesion reinforcement processing unit PAHP. Specifically, in the adhesion reinforcement processing unit PAHP, an adhesion reinforcement agent such as HMDS (hexamethyldisilazane) is applied to the substrate W, and the heating processing for the substrate W is performed. In each cooling unit CP, cooling processing for the substrate W is performed.

The thermal processing section 133 has an upper thermal processing section 103 provided above and a lower thermal processing section 104 provided below. A cooling unit CP, a plurality of thermal processing units PHP and an edge exposure unit EEW are provided in each of the upper thermal processing section 103 and the lower thermal processing section 104.

A local controller 300 is provided in a top portion of the thermal processing section 133. The local controller 300 controls operations of the development processing section 131, the transport section 132 and the thermal processing section 133 based on an instruction from the main controller 114 of FIG. 1.

In the edge exposure unit EEW, the exposure processing for a peripheral portion (edge exposure processing) of the substrate W is performed. The edge exposure processing is performed on the substrate W, so that a resist film on the peripheral portion of the substrate W is removed during the subsequent development processing. Thus, after the development processing, in the case where the peripheral portion of the substrate W comes into contact with another portion, the resist film on the peripheral portion of the substrate W is prevented from being stripped and becoming particles.

The cleaning drying processing section 162 is provided to correspond to the transport device 142 of FIG. 1. In the cleaning drying processing section 162, a plurality (three in the present example) of cleaning drying processing units SD1 and a plurality (two in the present example) of cleaning drying processing units SD2 are provided to be adjacent to the development block 13 and in a stack. The plurality of cleaning drying processing units SD2 are arranged above the plurality of cleaning drying processing units SD1.

Further, in the cleaning drying processing section 162, the plurality (six in the present example) of post-exposure heating processing units PEB are provided to be adjacent to the carry-in carry-out block 14B and in a stack. The plurality of post-exposure heating processing units PEB are provided in an upper portion of the cleaning drying processing section 162.

In the cleaning drying processing unit SD1, the cleaning and drying processing for the substrate W on which the exposure processing has not been performed are performed. In the cleaning drying processing unit SD2, the cleaning and drying processing for the substrate W on which the exposure processing has been performed are performed. In the post-exposure heating processing unit PEB, the post-exposure bake processing is performed.

(4) Transport Sections

Figure 4:
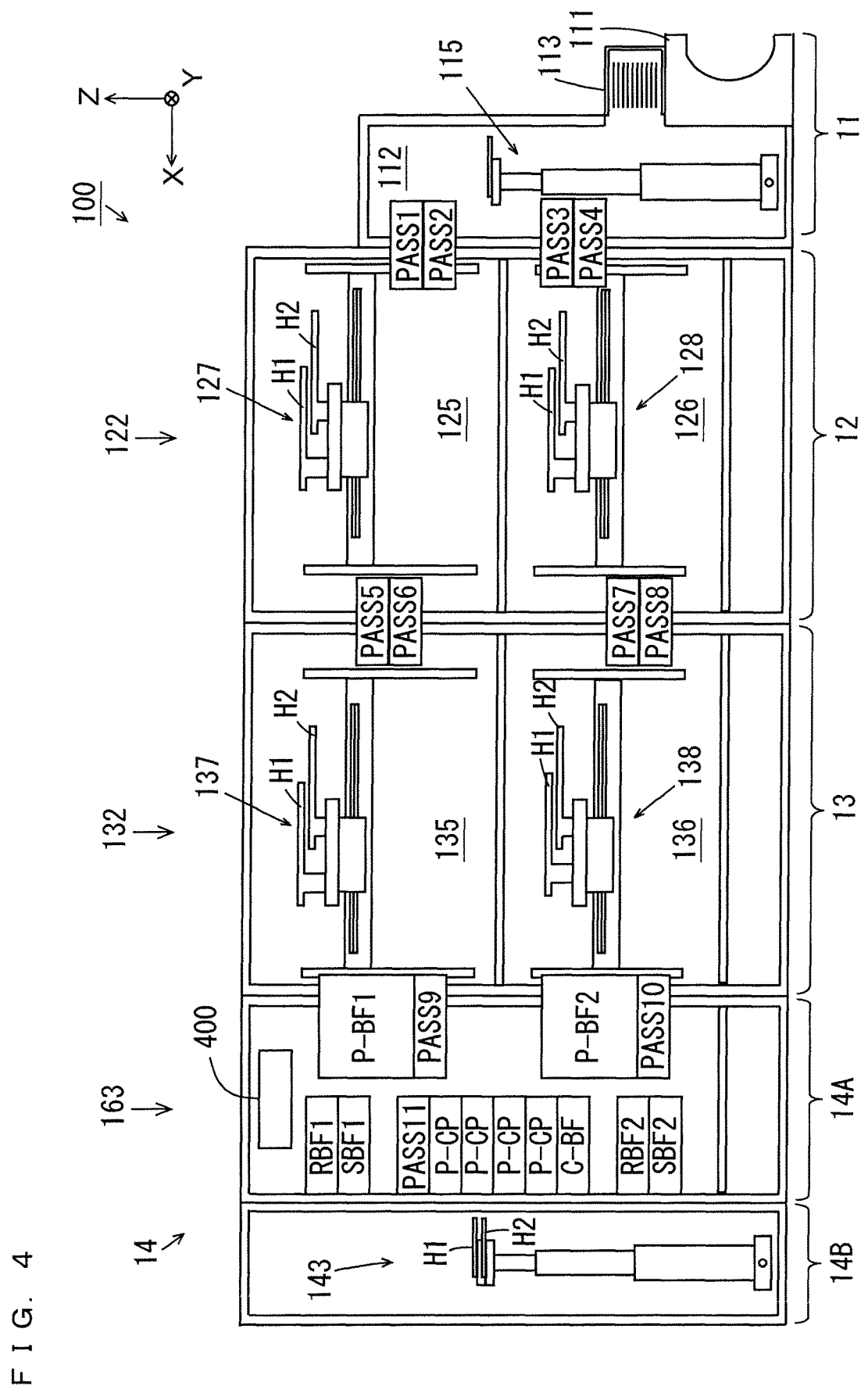
FIG. 4 is a schematic side view showing inner configurations of transport sections.

FIG. 4 is a schematic side view showing the inner configurations of the transport sections 122, 132, 163. As shown in FIG. 4, the transport section 122 has an upper transport chamber 125 and a lower transport chamber 126. The transport section 132 has an upper transport chamber 135 and a lower transport chamber 136. The transport device 127 (a transport robot) is provided in the upper transport chamber 125. The transport device 128 is provided in the lower transport chamber 126. The transport device 137 is provided in the upper transport chamber 135. The transport device 138 is provided in the lower transport chamber 136.

Each of the transport devices 127, 128, 137, 138 has a plurality of hands H1, H2 for holding and transporting the substrates W. Further, each of the transport devices 141 to 143 (FIG. 1) has a plurality of hands H1, H2 similar to the hands H1, H2 of each of the transport devices 127, 128, 137, 138.

The substrate platforms PASS1, PASS2 are provided between the transport section 112 and the upper transport chamber 125. The substrate platforms PASS3, PASS4 are provided between the transport section 112 and the lower transport chamber 126. The substrate platforms PASS5, PASS6 are provided between the upper transport chamber 125 and the upper transport chamber 135. The substrate platforms PASS7, PASS8 are provided between the lower transport chamber 126 and the lower transport chamber 136.

The placement buffer unit P-BF1 and the substrate platform PASS9 are provided between the upper transport chamber 135 and the transport section 163. The placement buffer unit P-BF2 and the substrate platform PASS10 are provided between the lower transport chamber 136 and the transport section 163.

The substrate platform PASS11, the plurality (four in the present example) of placement cooling units P-CP and the cooling buffer unit C-BF are provided to be stacked in this order from above and adjacent to the carry-in carry-out block 14B in the transport section 163. The returning buffer unit RBF1 and the sending buffer unit SBF1 are provided in a stack above the substrate platform PASS11. The returning buffer unit RBF2 and the sending buffer unit SBF2 are provided in a stack below the cooling buffer unit C-BF.

The transport device 127 receives the substrate W from and transfers the substrate W to the coating processing chambers 21, 22 (FIG. 2), the substrate platforms PASS1, PASS2, PASS5, PASS6 and the upper thermal processing section 101 (FIG. 3). The transport device 128 receives the substrate W from and transfers the substrate W to the coating processing chambers 23, 24 (FIG. 2), the substrate platforms PASS3, PASS4, PASS7, PASS8 and the lower thermal processing section 102 (FIG. 3).

The transport device 137 receives the substrate W from and transfers the substrate W to the development processing chambers 31, 32 (FIG. 2), the substrate platforms PASS5, PASS6, PASS9, the placement buffer unit P-BF1 and the upper thermal processing section 103 (FIG. 3). The transport device 138 receives the substrate W from and transfers the substrate W to the development processing chambers 33, 34 (FIG. 2), the substrate platforms PASS7, PASS8, PASS10, the placement buffer unit P-BF2 and the lower thermal processing section 104 (FIG. 3).

The transport device 141 (FIG. 1) receives the substrate W from and transfers the substrate W to the cleaning drying processing section 161 (FIG. 2), the placement buffer unit P-BF1, the substrate platforms PASS9, PASS11 and the placement cooling units P-CP. Further, the transport device 141 receives the substrate W from and transfers the substrate W to the returning buffer unit RBF1 and the sending buffer unit SBF1 depending on a progression state of preceding processing for the substrate W.

The transport device 142 (FIG. 1) receives the substrate W from and transfers the substrate W to the cleaning drying processing section 162 (FIG. 2), the placement buffer unit P-BF2, the substrate platforms PASS10, PASS11 and the placement cooling units P-CP. Further, the transport device 142 receives the substrate W from and transfers the substrate W to the returning buffer unit RBF2 and the sending buffer unit SBF2 depending on a progression state of preceding processing for the substrate W.

The transport device 143 receives the substrate W from and transfers the substrate W to the exposure device 15 (FIG. 1), the substrate platform PASS11 and the placement cooling units P-CP. Further, the transport device 143 receives the substrate W from and transfers the substrate W to the cooling buffer unit C-BF depending on a progression state of preceding processing for the substrate W.

Further, a local controller 400 is provided in a top portion of the transport section 163. The local controller 400 controls operations in the cleaning drying processing sections 161, 162 and the transport section 163, and also controls operations in the carry-in carry-out block 14B based on an instruction from the main controller 114 of FIG. 1.

(5) Steps in Substrate Processing

The operations in the indexer block 11, the coating block 12, the development block 13, the cleaning drying processing block 14A and the carry-in carry-out block 14B during the substrate processing will be described with reference to FIGS. 1 to 4. In the below-mentioned substrate processing, a time period required for the processing performed by the substrate processing apparatus 100 and the exposure device 15 is estimated, and operations of the transport devices 115, 127, 128, 137, 138, 141 to 143 are controlled based on the estimated time period.

The carrier 113 in which the substrates W that have not been processed are stored is placed on each carrier platform 111 (FIG. 1) in the indexer block 11. The transport device 115 transports the substrate W that has not been processed from the carrier 113 to each of the substrate platforms PASS1, PASS3 (FIG. 4). Further, the transport device 115 transports the substrate W that has been processed and is placed on each of the substrate platforms PASS2, PASS4 (FIG. 4) to the carrier 113.

In the coating block 12, the transport device 127 (FIG. 4) sequentially transports the substrate W placed on the substrate platform PASS1 to the adhesion reinforcement processing unit PAHP (FIG. 3), the cooling unit CP (FIG. 3) and the coating processing chamber 22 (FIG. 2). Next, the transport device 127 sequentially transports the substrate W on which an anti-reflection film has been formed in the coating processing chamber 22 to the thermal processing unit PHP (FIG. 3), the cooling unit CP (FIG. 3) and the coating processing chamber 21 (FIG. 2). Subsequently, the transport device 127 sequentially transports the substrate W on which a resist film has been formed in the coating processing chamber 21 to the thermal processing unit PHP (FIG. 3) and the substrate platform PASS5 (FIG. 4).

In this case, the adhesion reinforcement processing is performed on the substrate W in the adhesion reinforcement processing unit PAHP, and then the substrate W is cooled to a temperature suitable for the formation of an anti-reflection film in the cooling unit CP. Then, an anti-reflection film is formed on the substrate W by the coating processing unit 129 (FIG. 2) in the coating processing chamber 22. Subsequently, the thermal processing for the substrate W is performed in the thermal processing unit PHP, and then the substrate W is cooled to a temperature suitable for the formation of a resist film in the cooling unit CP. Then, a resist film is formed on the substrate W by the coating processing unit 129 (FIG. 2) in the coating processing chamber 21. Thereafter, the thermal processing for the substrate W is performed in the thermal processing unit PHP, and then the substrate W is placed on the substrate platform PASS5.

Further, the transport device 127 transports the substrate W on which the development processing has been performed and which is placed on the substrate platform PASS6 (FIG. 4) to the substrate platform PASS2 (FIG. 4).

The transport device 128 (FIG. 4) sequentially transports the substrate W placed on the substrate platform PASS3 to an adhesion reinforcement processing unit PAHP (FIG. 3), a cooling unit CP (FIG. 3) and the coating processing chamber 24 (FIG. 2). Next, the transport device 128 sequentially transports the substrate W on which an anti-reflection film has been formed in the coating processing chamber 24 to a thermal processing unit PHP (FIG. 3), a cooling unit CP (FIG. 3) and the coating processing chamber 23 (FIG. 2). Subsequently, the transport device 128 sequentially transports the substrate W on which a resist film has been formed in the coating processing chamber 23 to a thermal processing unit PHP (FIG. 3) and the substrate platform PASS7 (FIG. 4).

Further, the transport device 128 (FIG. 4) transports the substrate W on which the development processing has been performed and which is placed on the substrate platform PASS8 (FIG. 4) to the substrate platform PASS4 (FIG. 4). The contents of the processing for the substrate W in the coating processing chambers 23, 24 (FIG. 2) and the lower thermal processing section 102 (FIG. 3) are similar to the contents of the processing for the substrate W in the coating processing chambers 21, 22 (FIG. 2) and the upper thermal processing section 101 (FIG. 3), described above.

In the development block 13, the transport device 137 (FIG. 4) sequentially transports the substrate W on which a resist film has been formed and which is placed on the substrate platform PASS5 to the edge exposure unit EEW (FIG. 3) and the placement buffer unit P-BF1 (FIG. 4). In this case, the edge exposure processing is performed on the substrate W in the edge exposure unit EEW. The substrate W on which the edge exposure processing has been performed is placed on the placement buffer unit P-BF1.

Further, the transport device 137 (FIG. 4) takes out the substrate Won which the post-exposure bake processing has been performed from the substrate platform PASS9 (FIG. 4). The transport device 137 sequentially transports the substrate W to a cooling unit CP (FIG. 3), one of the development processing chambers 31, 32, a thermal processing unit PHP (FIG. 3) and the substrate platform PASS6 (FIG. 4).

In this case, the substrate W is cooled to a temperature suitable for the development processing in the cooling unit CP, and then the development processing for the substrate W is performed in one of the development processing chambers 31, 32. Thereafter, the thermal processing for the substrate W is performed in the thermal processing unit PHP, and the substrate W is placed on the substrate platform PASS6.

The transport device 138 (FIG. 4) sequentially transports the substrate W on which a resist film has been formed and which is placed on the substrate platform PASS7 to the edge exposure unit EEW (FIG. 3) and the placement buffer unit P-BF2 (FIG. 4).

Further, the transport device 138 (FIG. 4) takes out the substrate W on which the post-exposure bake processing has been performed from the substrate platform PASS10 (FIG. 4). The transport device 138 sequentially transports the substrate W to a cooling unit CP (FIG. 3), one of the development processing chambers 33, 34 (FIG. 2), a thermal processing unit PHP (FIG. 3) and the substrate platform PASS8 (FIG. 4). The contents of the processing for the substrate W in the development processing chambers 33, 34 and the lower thermal processing section 104 are similar to the contents of the processing for the substrate W in the development processing chambers 31, 32 (FIG. 2) and the upper thermal processing section 103 (FIG. 3), described above.

In the cleaning drying processing block 14A, the transport device 141 (FIG. 1) transports the substrate W placed on the placement buffer unit P-BF1 to a cleaning drying processing unit SD1 (FIG. 2) and a placement cooling unit P-CP (FIG. 4). In this case, the cleaning and drying processing for the substrate W are performed in the cleaning drying processing unit SD1, and then the substrate W is cooled in the placement cooling unit P-CP to a temperature suitable for the exposure processing in the exposure device 15 (FIG. 1).

Further, the transport device 141 transports the substrate W placed on the substrate platform PASS11 (FIG. 4) to a cleaning drying processing unit SD2 (FIG. 2), a post-exposure heating processing unit PEB (FIG. 2) and the substrate platform PASS9. In this case, the cleaning and drying processing for the substrate W are performed in the cleaning drying processing unit SD2. Thereafter, the post-exposure bake processing is performed in the post-exposure heating processing unit PEB, and the substrate W is placed on the substrate platform PASS9.

The transport device 142 (FIG. 1) transports the substrate W placed on the placement buffer unit P-BF2 to a cleaning drying processing unit SD1 (FIG. 3) and a placement cooling unit P-CP (FIG. 4). Further, the transport device 142 transports the substrate W placed on the substrate platform PASS11 (FIG. 4) to a cleaning drying processing unit SD2 (FIG. 3), a post-exposure heating processing unit PEB (FIG. 3) and the substrate platform PASS10.

In the carry-in carry-out block 14B, the transport device 143 (FIG. 4) carries in the cooled substrate W that is placed on a placement cooling unit P-CP to the substrate inlet 15a (FIG. 1) of the exposure device 15. Further, the transport device 143 takes out the substrate W on which the exposure processing has been performed from the substrate outlet 15b (FIG. 1) of the exposure device 15 and transports the substrate W to the substrate platform PASS11 (FIG. 4).

(6) Cooling Buffer Unit

As described above, the transport devices 115, 127, 128, 137, 138, 141 to 143 (hereinafter simply referred to as the transport devices) are controlled based on a time period required for processing performed by the substrate processing apparatus 100 and the exposure device 15. Thus, each transport device can continuously or concurrently perform an operation of taking out the substrate W on which processing has been performed from a predetermined placement position and an operation of placing the substrate W on which processing has not been performed on the placement position or another placement position. "Concurrently performing" the two operations means here that respective periods during which the two respective operations are performed at least partially overlap with each other.

However, in the case where an operation of the exposure device 15 is temporarily stopped, the transport device can no longer perform the above-mentioned operations. The same is true for the case where the substrate W remains in the exposure device 15. In the case where the exposure device 15 is stopped, or the case where the substrate W remains in the exposure device 15, the cooling buffer unit C-BF is used. FIGS. 5A to 5C and 6A to 6C are diagrams for explaining an application example of the cooling buffer unit C-BF. In FIGS. 5A to 5C and 6A to 6C, the returning buffer units RBF1, RBF2 and the sending buffer units SBF1, SBF2 of FIG. 4 are not shown.

Figure 5A:
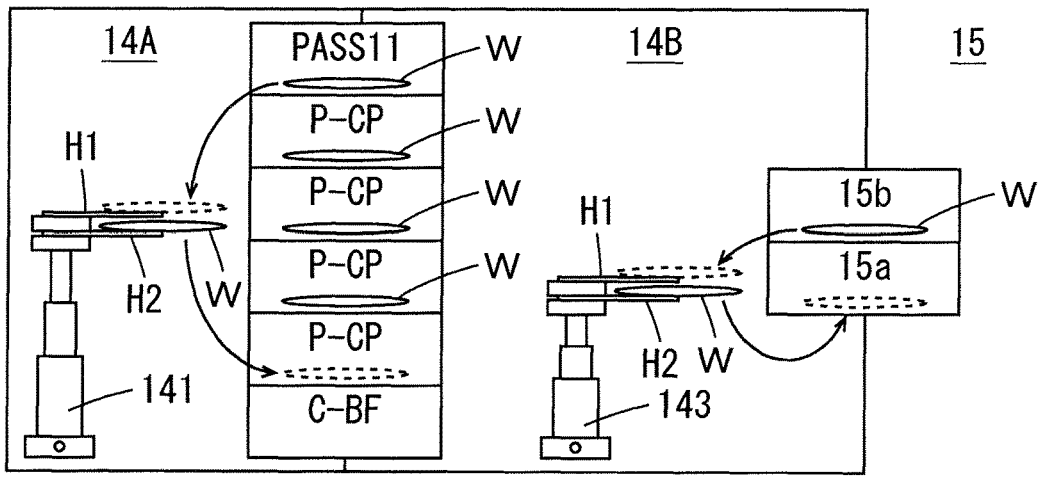
FIGS. 5A to 5C are diagrams for explaining an application example of a cooling buffer unit.
Figure 5B:
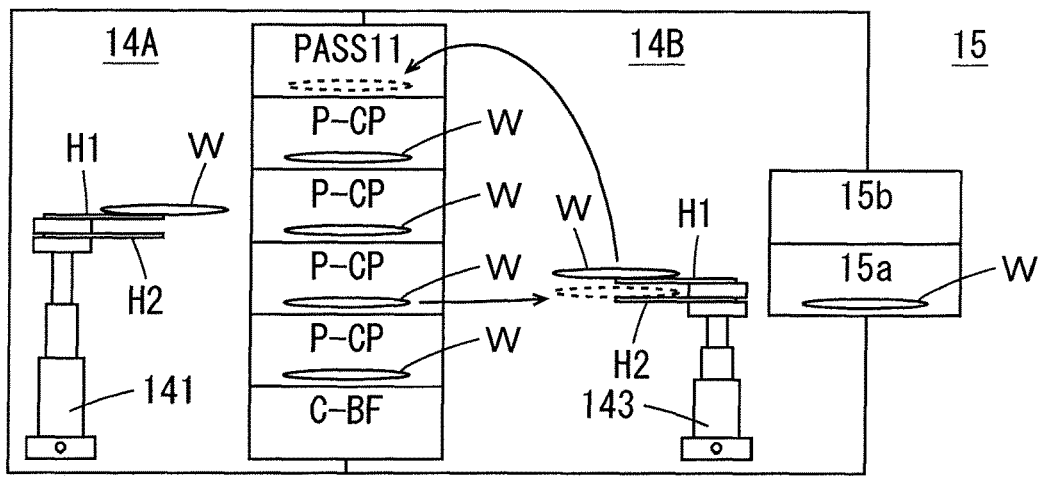

In FIG. 5A, the transport device 141 carries out the substrate W on which the exposure processing has been performed from the substrate platform PASS11 and carries in the substrate W on which the cleaning and drying processing have been performed to a placement cooling unit P-CP. Further, the transport device 143 carries out the substrate W on which the exposure processing has been performed from the substrate outlet 15b, and carries in the cooled substrate W to the substrate inlet 15a. Next, in FIG. 5B, the transport device 143 carries out the cooled substrate W from the placement cooling unit P-CP and carries in the substrate W on which the exposure processing has been performed to the substrate platform PASS11.

Figure 5C:
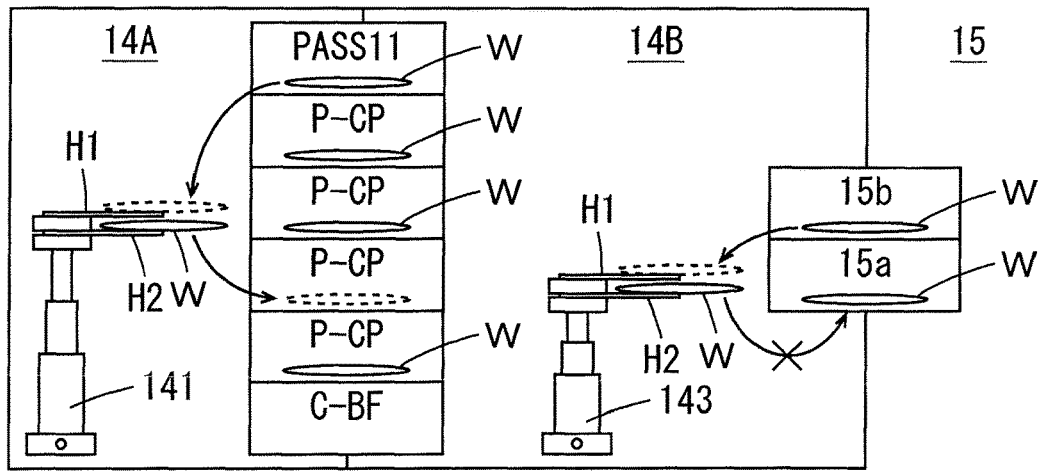

Thereafter, in FIG. 5C, in the case where the processing is progressing based on the estimated processing time period, the substrate W on which the exposure processing has been performed is carried out from the substrate outlet 15b, and the cooled substrate W is carried into the substrate inlet 15a. The case where an operation of the exposure device 15 is temporarily stopped or the case where the substrate W remains in the substrate inlet 15a is considered here. In this case, the substrate inlet 15a is unable to receive the substrate W. Thus, although the transport device 143 can carry out the substrate W on which the exposure processing has been performed from the substrate outlet 15b, the transport device 143 cannot carry in the cooled substrate W to the substrate inlet 15a as indicated by "x" in FIG. 5C. Therefore, the efficiency of processing for the substrate W in each of the cleaning drying processing block 14A and the carry-in carry-out block 14B is reduced.

Figure 6A:
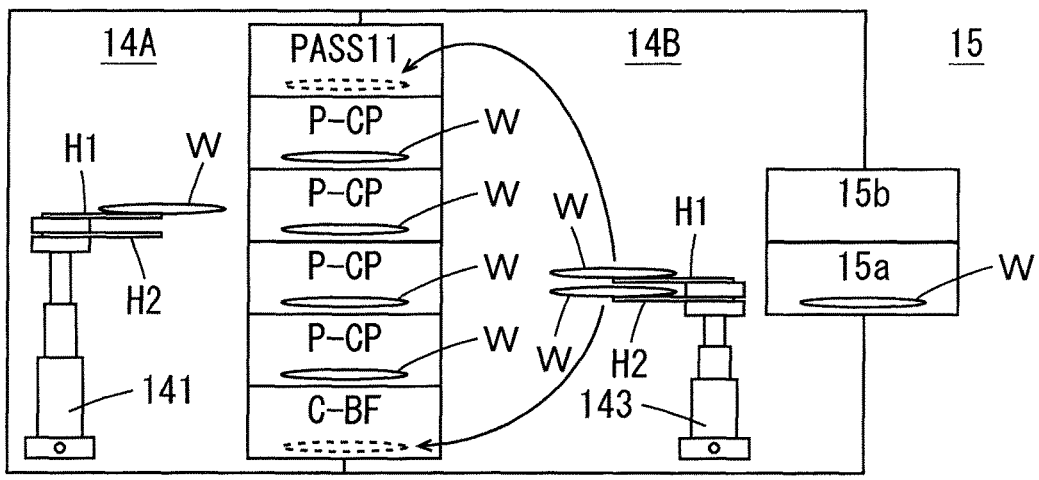
FIGS. 6A to 6C are diagrams for explaining the application example of the cooling buffer unit.

Then, in FIG. 6A, the transport device 143 carries in the cooled substrate W to the cooling buffer unit C-BF, and carries in the substrate W on which the exposure processing has been performed to the substrate platform PASS11. Similarly to the placement cooling unit P-CP, the substrate W is cooled in the cooling buffer unit C-BF to a temperature suitable for the exposure processing in the exposure device 15.

Figure 6B:
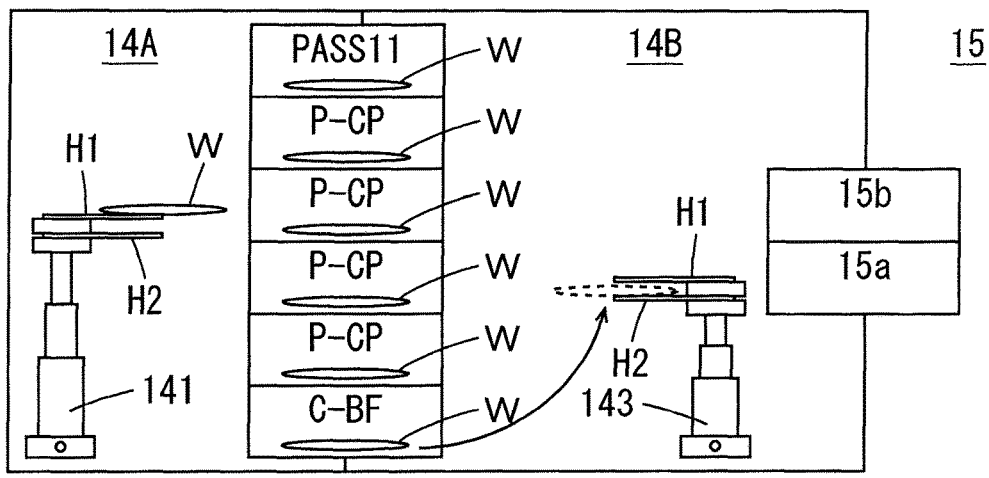

Thereafter, in FIG. 6B, the operation of the exposure device 15 is restarted, or remaining of the substrate W in the exposure device 15 is resolved, whereby the substrate W in the substrate inlet 15a is taken into the exposure device 15. Thus, the substrate inlet 15a becomes able to receive the substrate W. At this time, the transport device 143 carries out the cooled substrate W from the cooling buffer unit C-BF. Subsequently, in FIG. 6C, the transport device 143 carries in the cooled substrate W to the substrate inlet 15a. Further, in the case where the substrate Won which the exposure processing has been performed is placed on the substrate outlet 15b, the transport device 143 carries out the substrate W from the substrate outlet 15b.

In the above-mentioned configuration, even in the case where the substrate inlet 15a is unable to receive the substrate W, it is not necessary for the transport device 143 to wait while holding the substrate W that is cooled to a temperature suitable for the exposure processing until the substrate inlet 15a becomes able to receive the substrate W. Further, when the substrate inlet 15a becomes able to receive the substrate W, the transport device 143 can immediately carries in the substrate W that is cooled by the cooling buffer unit C-BF in a temperature suitable for the exposure processing to the substrate inlet 15a. Thus, a reduction in efficiency of processing for the substrate W in each of the cleaning drying processing block 14A and the carry-in carry-out block 14B can be minimized.

In the case where the substrate W remains in the substrate processing apparatus 100, the placement buffer units P-BF1, P-BF2, the returning buffer units RBF1, RBF2 or the sending buffer units SBF1, SBF2 are used. Specifically, in the case where the cleaning drying processing unit SD1 of FIG. 2 is unable to receive the substrate W, the substrate W is temporarily stored in the placement buffer unit P-BF1 (FIG. 4) by the transport device 141. In this case, after the cleaning drying processing unit SD1 of FIG. 2 becomes able to receive the substrate W, the substrate W is transported by the transport device 141 from the placement buffer unit P-BF1 to the cleaning drying processing unit SD1.

In the case where the cleaning drying processing unit SD1 of FIG. 3 is unable to receive the substrate W, the substrate W is temporarily stored in the placement buffer unit P-BF2 (FIG. 4) by the transport device 142. In this case, after the cleaning drying processing unit SD1 of FIG. 3 becomes able to receive the substrate W, the substrate W is transported by the transport device 142 from the placement buffer unit P-BF2 to the cleaning drying processing unit SD1.

In the case where the substrate platform PASS9 is unable to receive the substrate W, the substrate W is transported to the returning buffer unit RBF1 (FIG. 4) by the transport device 141 and temporarily placed. In this case, after the substrate platform PASS9 becomes able to receive the substrate W, the substrate W is transported by the transport device 141 from the post-exposure heating processing unit PEB to the substrate platform PASS9.

In the case where the substrate platform PASS10 is unable to receive the substrate W, the substrate W is transported to the returning buffer unit RBF2 (FIG. 4) by the transport device 142 and temporarily placed. In this case, after the substrate platform PASS10 becomes able to receive the substrate W, the substrate W is transported by the transport device 142 from the post-exposure heating processing unit PEB to the substrate platform PASS10.

Further, in the case where none of the placement cooling units P-CP is able to receive the substrate W from a cleaning drying processing unit SD1 of FIG. 2, the substrate W is transported to the sending buffer unit SBF1 (FIG. 4) by the transport device 141 and temporarily placed. In this case, after any of the placement cooling units P-CP becomes able to receive the substrate W, the substrate W is transported from the sending buffer unit SBF1 to the placement cooling unit P-CP by the transport device 141.

In the case where none of the placement cooling units P-CP is able to receive the substrate W from a cleaning drying processing unit SD1 of FIG. 3, the substrate W is transported to the sending buffer unit SBF2 (FIG. 4) by the transport device 142 and temporarily placed. In this case, after any of the placement cooling units P-CP becomes able to receive the substrate W, the substrate W is transported from the sending buffer unit SBF2 to the placement cooling unit P-CP by the transport device 142.

Figure 6C:
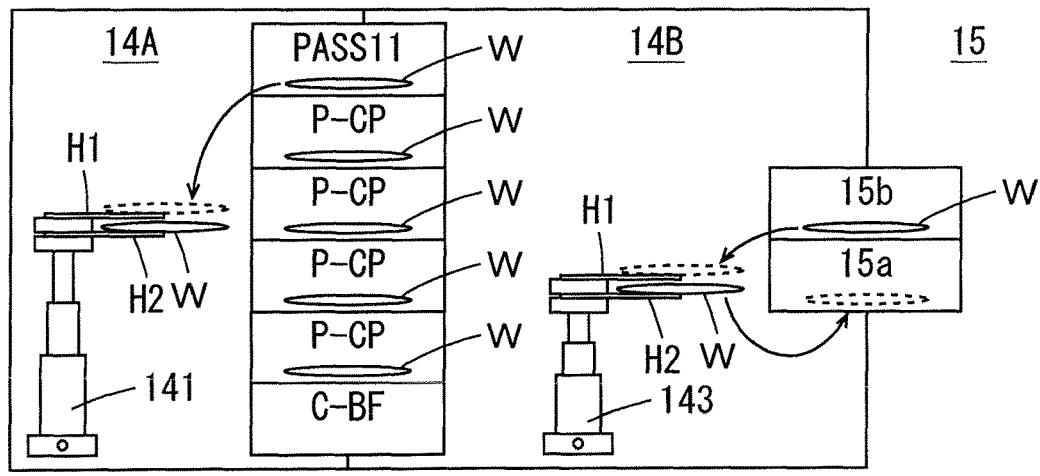

In the example of FIG. 6C, the substrate W is placed on each of all of the placement cooling units P-CP, and none of the placement cooling units P-CP is able to receive the substrate W. In such a case, when the transport device 141 is holding the substrate W on which the cleaning and drying processing have been performed, the transport device 141 transports the substrate W to the sending buffer unit SBF1 of FIG. 4. Similarly, when the transport device 142 of FIG. 1 is holding the substrate Won which the cleaning and drying processing have been performed, the transport device 142 transports the substrate W to the sending buffer unit SBF2 of FIG. 4.

(7) Control System of Transport Devices

Figure 7:
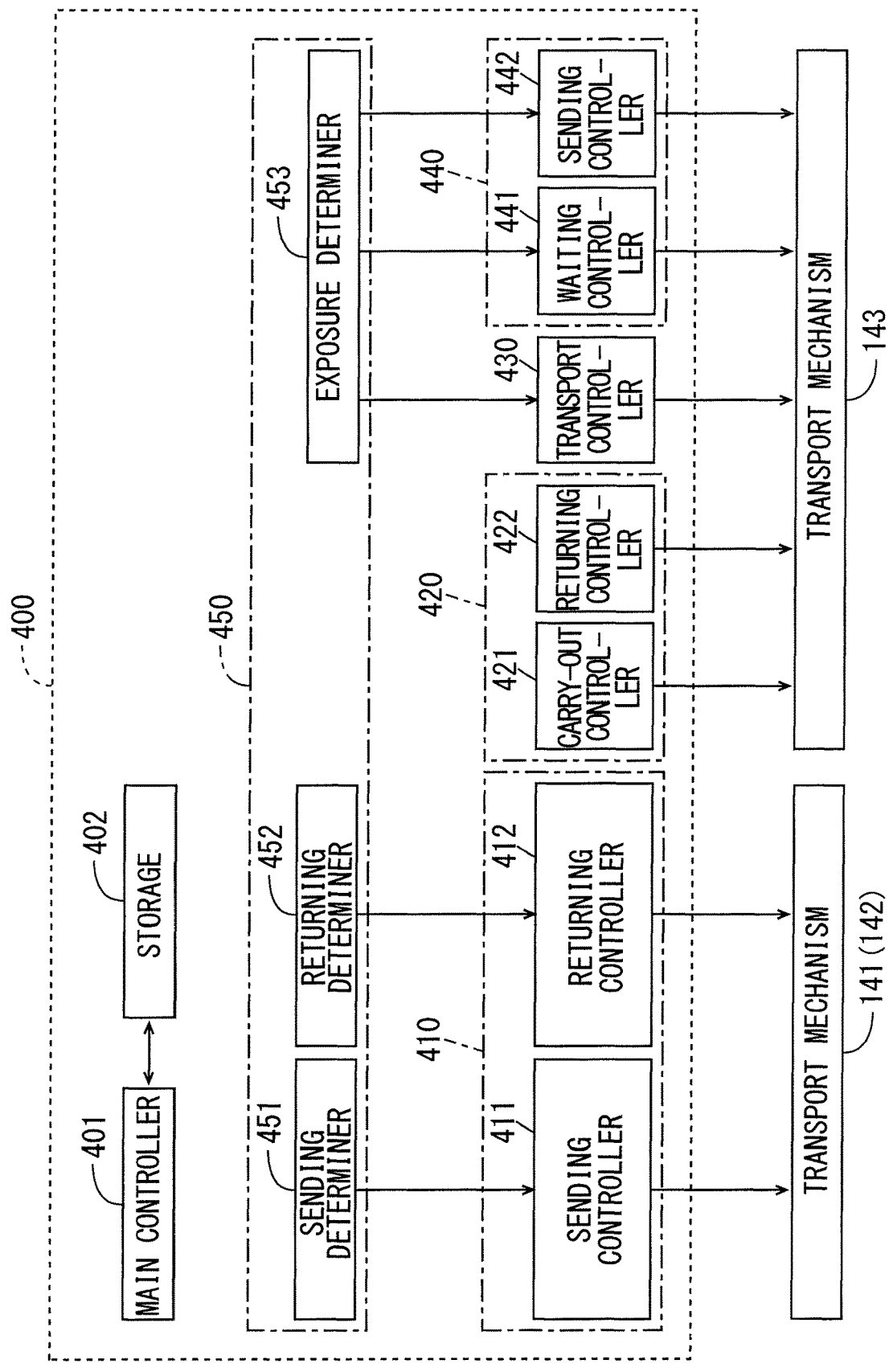
FIG. 7 is a block diagram showing a configuration of a local controller for controlling transport devices.

FIG. 7 is a block diagram showing the configuration of the local controller 400 for controlling the transport devices 141 to 143. As shown in FIG. 7, the local controller 400 includes a main controller 401, a storage 402, transport controllers 410, 420, 430, 440 and a determiner 450.

The main controller 401 includes a CPU (Central Processing Unit), for example. The storage 402 includes a non-volatile memory or a hard disc, for example, and stores a transport control program for controlling the transport devices 141 to 143. The main controller 401 executes the transport control program stored in the storage 402, whereby functions of the transport controllers 410, 420, 430, 440 and the determiner 450 are realized.

The determiner 450 includes a sending determiner 451, a returning determiner 452 and an exposure determiner 453. The sending determiner 451 determines whether each placement cooling unit P-CP of FIG. 4 is able to receive the substrate W and supplies the transport controller 410 with a result of determination. The returning determiner 452 determines whether the substrate platforms PASS9, PASS10 of FIG. 4 are able to receive the substrate W and supplies the transport controller 410 with a result of determination. The exposure determiner 453 determines whether the exposure device 15 of FIG. 1 is able to receive the substrate W and supplies the transport controllers 430, 440 with a result of determination.

For example, a photoelectric sensor for detecting absence and presence of the substrate W is provided in each of the placement cooling units P-CP, the substrate platforms PASS9, PASS10 and the substrate inlet 15a. The sending determiner 451, the returning determiner 452 and the exposure determiner 453 determine whether the substrate W can be received based on an output signal of the photoelectric sensor of each of the placement cooling units P-CP, the substrate platforms PASS9, PASS10 and the substrate inlet 15a.

The transport controller 410 is configured to control operations of each of the transport devices 141, 142. The transport controller 410 includes a sending controller 411 and a returning controller 412. While the control related to the transport device 141 will be described below, the control related to the transport device 142 is similar to the control related to the transport device 141.

The sending controller 411 controls the transport device 141 such that the substrate W placed on the placement buffer unit P-BF1 of FIG. 4 is transported to the cleaning drying processing unit SD1 of FIG. 2. Further, in the case where the sending determiner 451 determines that any of the placement cooling units P-CP is able to receive the substrate W, the sending controller 411 controls the transport device 141 such that the substrate W is transported from the cleaning drying processing unit SD1 to the placement cooling unit P-CP.

On the other hand, in the case where the sending determiner 451 determines that none of the placement cooling units P-CP is able to receive the substrate W, the sending controller 411 controls the transport device 141 such that the substrate W is transported from the cleaning drying processing unit SD1 to the sending buffer unit SBF1 of FIG. 4. After any of the placement cooling units P-CP becomes able to receive the substrate W, the sending controller 411 controls the transport device 141 such that the substrate W is transported from the sending buffer unit SBF1 to the placement cooling unit P-CP.

The returning controller 412 controls the transport device 141 such that the substrate W placed on the substrate platform PASS11 of FIG. 4 is transported to the cleaning drying processing unit SD2 of FIG. 2 and then transported to the post-exposure heating processing unit PEB of FIG. 2. In the case where the returning determiner 452 determines that the substrate platform PASS9 of FIG. 4 is able to receive the substrate W, the returning controller 412 controls the transport device 141 such that the substrate W is transported from the post-exposure heating processing unit PEB to the substrate platform PASS9.

On the other hand, in the case where the returning determiner 452 determines that the substrate platform PASS9 is unable to receive the substrate W, the returning controller 412 controls the transport device 141 such that the substrate W is transported from the cleaning drying processing unit SD2 to the returning buffer unit RBF1 of FIG. 4. The returning controller 412 controls the transport device 141 such that, after the substrate platform PASS9 becomes able to receive the substrate W, the substrate W is transported to the substrate platform PASS9 from the returning buffer unit RBF1.

The transport controllers 420, 430, 440 are configured to control the operation of the transport device 143. The transport controller 420 includes a carry-out controller 421 and a returning controller 422. The transport controller 440 includes a waiting controller 441 and a sending controller 442. The carry-out controller 421 controls the transport device 143 such that the substrate W placed on the placement cooling unit P-CP is carried out. The returning controller 422 controls the transport device 143 such that the substrate W is transported from the exposure device 15 to the substrate platform PASS11.

In the case where the exposure determiner 453 determines that the exposure device 15 is able to receive the substrate W, the transport controller 430 controls the transport device 143 such that the substrate W that has been carried out is transported to the exposure device 15. In the case where the exposure determiner 453 determines that the exposure device 15 is unable to receive the substrate W, the waiting controller 441 controls the transport device 143 such that the substrate W that has been carried out is transported to the cooling buffer unit C-BF of FIG. 4. In the case where the exposure determiner 453 determines that the exposure device 15 is able to receive the substrate W, the sending controller 442 controls the transport device 143 such that the substrate W is transported from the cooling buffer unit C-BF to the exposure device 15.

(8) Transport Control Processing

Figure 8:
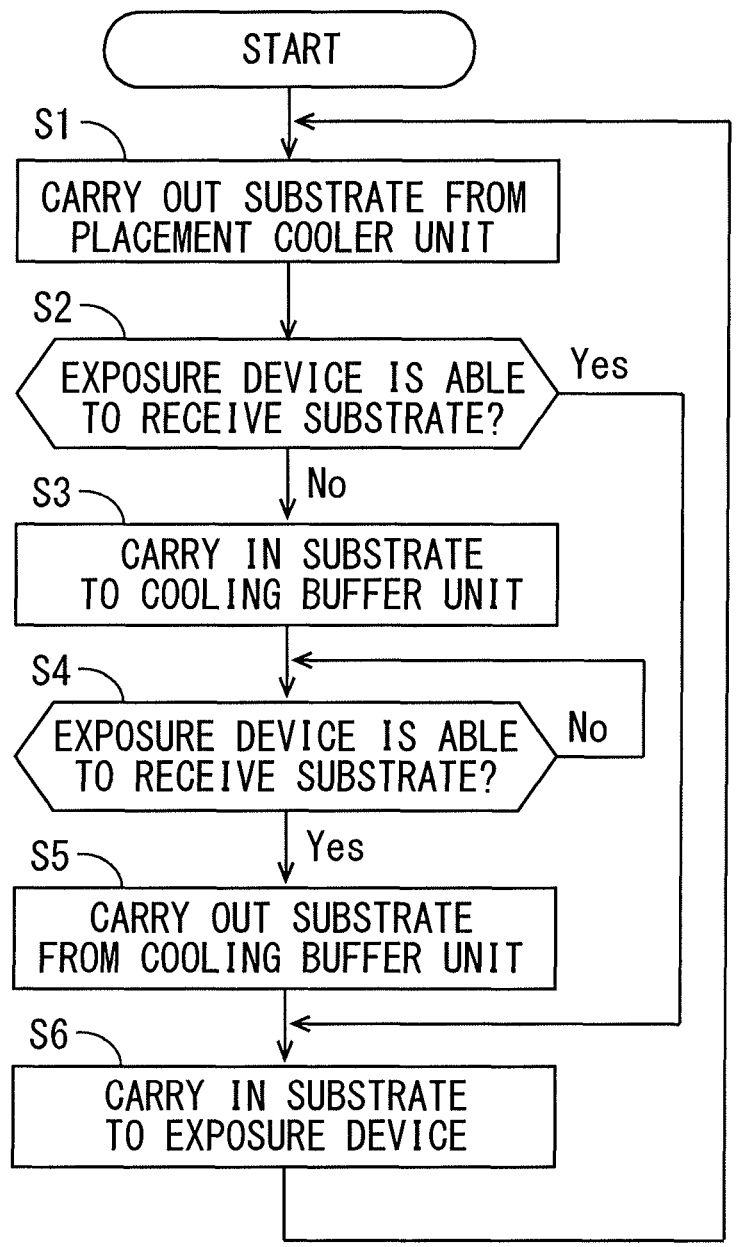
FIG. 8 is a flow chart showing part of an operation of a main controller of the local controller of FIG. 7 in transport control processing.

FIG. 8 is a flow chart showing part of the operation of the main controller 401 of the local controller 400 of FIG. 7 in the transport control processing. In the transport control processing of FIG. 8, the operation of the transport device 143 for transporting the substrate W from a placement cooling unit P-CP to the exposure device 15 is controlled. The transport control processing of FIG. 8 is performed concurrently with the transport control processing for transporting the substrate W from the exposure device 15 to the substrate platform PASS11 of FIG. 4 by the transport device 143. The transport control processing performed by the main controller 401 will be described with reference to the substrate processing apparatus 100 of FIG. 4, the local controller 400 of FIG. 7 and the flow chart of FIG. 8.

First, the main controller 401 allows the substrate W to be carried out from any of the placement cooling units P-CP by the transport device 143 (step S1). In the case where the transport device 143 is holding the substrate W to be carried into the substrate platform PASS11, the main controller 401 allows the step S1 to be performed and the substrate W to be carried into the substrate platform PASS11.

Next, the main controller 401 determines whether the exposure device 15 is able to receive the substrate W (step S2). In the case where the exposure device 15 is unable to receive the substrate W, the main controller 401 allows the substrate W that has been carried out to be carried into the cooling buffer unit C-BF by the transport device 143 (step S3). Thereafter, the main controller 401 determines whether the exposure device 15 is able to receive the substrate W (step S4). In the case where the substrate W is unable to receive the exposure device 15, the main controller 401 waits until the exposure device 15 becomes able to receive the substrate W.

In the case where the exposure device 15 is able to receive the substrate W in the step S4, the main controller 401 allows the substrate W to be carried out from the cooling buffer unit C-BF by the transport device 143 (step S5), and the processing proceeds to the step S6. Also in the case where the exposure device 15 is able to receive the substrate W in the step S2, the main controller 401 allows the processing to proceed to the step S6.

In the step S6, the main controller 401 allows the substrate W that has been carried out to be carried into the exposure device 15 by the transport device 143 (step S6). In the case where the substrate W on which the exposure processing has been performed is present in the exposure device 15, the main, controller 401 allows the step S6 to be performed and allows the substrate W to be carried out from the exposure device 15. Thereafter, the main controller 401 allows the processing to return to the step S1.

(9) Effects

In the substrate processing apparatus 100 according to the present embodiment, in the case where the operation of the exposure device 15 is temporarily stopped, or the case where the substrate W remains in the exposure device 15, the substrate W is placed on the cooling buffer unit C-BF until the exposure device 15 becomes able to receive the substrate W. Therefore, it is not necessary for the transport device 143 to continue holding the substrate W to be transported to the exposure device 15. Thus, the transport device 143 can continue transporting another substrate W in the carry-in carry-out block 14B.

Further, because the temperature of the substrate W placed on the cooling buffer unit C-BF is maintained, the substrate W having a predetermined temperature can be transported to the exposure device 15 immediately after the exposure device 15 becomes able to receive the substrate W. As a result, the substrate W in an appropriate state can be carried into the exposure device 15 while a reduction in efficiency of processing for the substrate W is inhibited according to the state of the exposure device 15.

Further, in the case where none of the placement cooling units P-CP is able to receive the substrate W, the substrate W that has been cleaned by the cleaning drying processing unit SD1 is transported to each of the sending buffer units SBF1, SBF2. After any of the placement cooling units P-CP becomes able to receive the substrate W, the substrate W stored in each of the sending buffer units SBF1, SBF2 is transported to the placement cooling unit P-CP.

In this case, it is not necessary for each of the transport devices 141, 142 to continue holding the substrates W to be transported to a placement cooling unit P-CP. Thus, each of the transport devices 141, 142 can continue transporting another substrate W in the cleaning drying processing block 14A. Further, after the placement cooling unit P-CP becomes able to receive the substrate W, the substrate W placed on each of the sending buffer units SBF1, SBF2 can be immediately transported to a placement cooling unit P-CP. Therefore, a reduction in efficiency of processing for the substrate W can be more sufficiently inhibited.

(10) Another Embodiment

While the cooling buffer unit C-BF is provided separately from the platform cooling units P-CP in the above-mentioned embodiment, the present invention is not limited to this. FIGS. 9A, 9B, 9C, 10A and 10B are diagrams showing the configuration of a cooling buffer unit in another embodiment. As shown in FIGS. 9A, 9B, 9C, 10A and 10B, in the present embodiment, the cooling buffer unit C-BF is not provided, and a plurality (five in the present example) of placement cooling units P-CP are provided. The five placement cooling units P-CP are respectively referred to as placement cooling units P-CP1 to P-CP5.

Figure 9A:
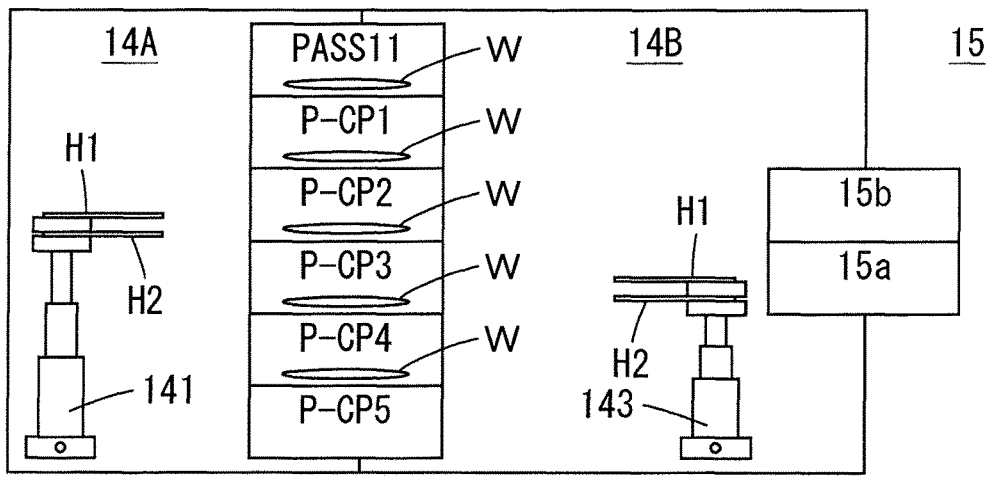
FIGS. 9A to 9C are diagrams showing a configuration of a cooling buffer unit in another embodiment.

As shown in FIG. 9A, when the substrate W is transported from the cleaning drying processing block 14A to the carry-in carry-out block 14B for the first time, the transport devices 141 to 143 are controlled such that any of the placement cooling units P-CP1 to P-CP4 is used, and are controlled such that the placement cooling unit P-CP5 is not used. At this time, the transport devices 141 to 143 are controlled such that the placement cooling unit P-CP5 is used as a cooling buffer unit. Therefore, when the substrate inlet 15a is unable to receive the substrate W, the transport device 143 carries in the held substrate W to the placement cooling unit P-CP5.

Figure 9B:
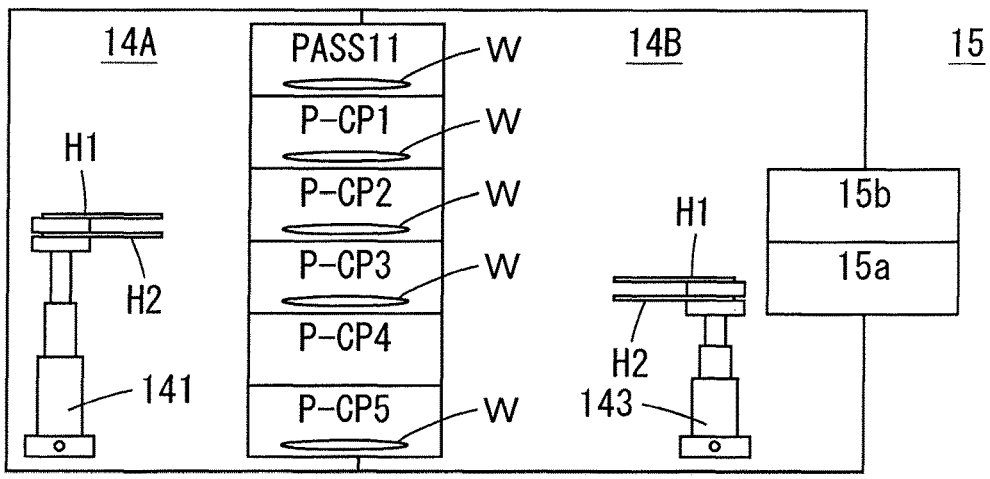

Similarly, as shown in FIG. 9B, when the substrate W is transported from the cleaning drying processing block 14A to the carry-in carry-out block 14B for the second time, any of the placement cooling units P-CP1, P-CP2, P-CP3, P-CP5 is used, and the placement cooling unit P-CP4 is not used. At this time, the placement cooling unit P-CP4 is used as a cooling buffer unit.

Figure 9C:
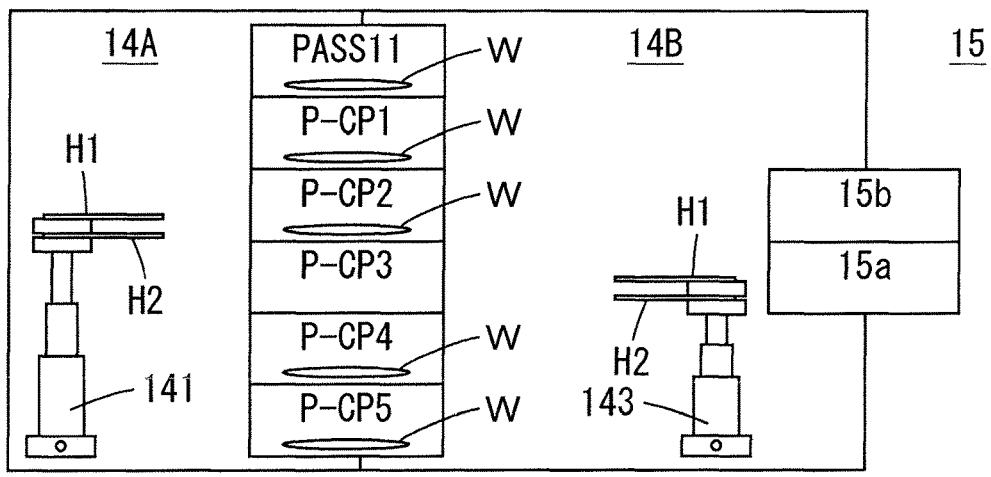

As shown in FIG. 9C, when the substrate W is transported from the cleaning drying processing block 14A to the carry-in carry-out block 14B for the third time, any of the placement cooling units P-CP1, P-CP2, P-CP4, P-CP5 is used, and the placement cooling unit P-CP3 is not used. At this time, the placement cooling unit P-CP3 is used as a cooling buffer unit.

Figure 10A:
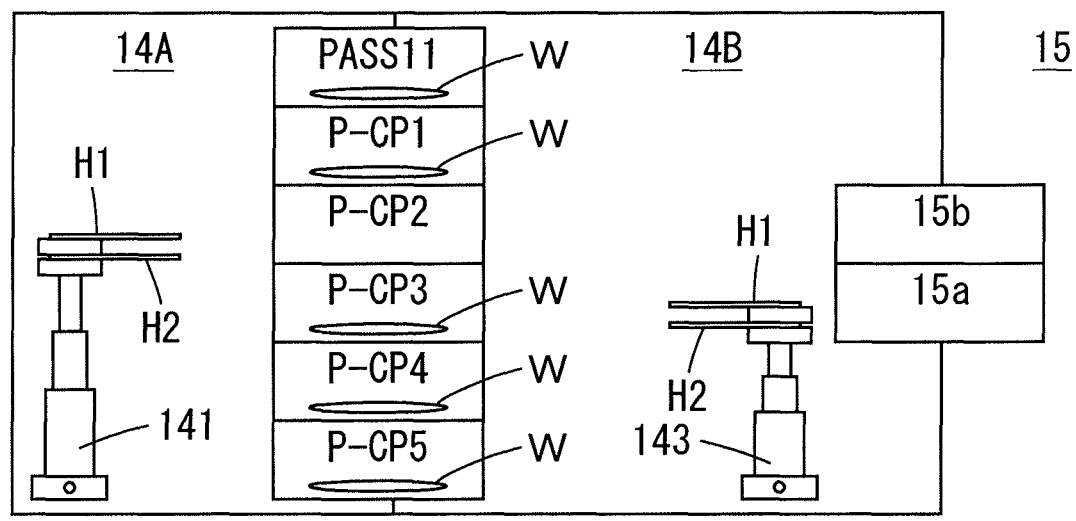
FIGS. 10A and 10B are diagrams showing the configuration of the cooling buffer unit in the other embodiment.

As shown in FIG. 10A, when the substrate W is transported from the cleaning drying processing block 14A to the carry-in carry-out block 14B for the fourth time, any of the placement cooling units P-CP1, P-CP3, P-CP4, P-CP5 is used, and the placement cooling unit P-CP2 is not used. At this time, the placement cooling unit P-CP2 is used as a cooling buffer unit.

Figure 10B:
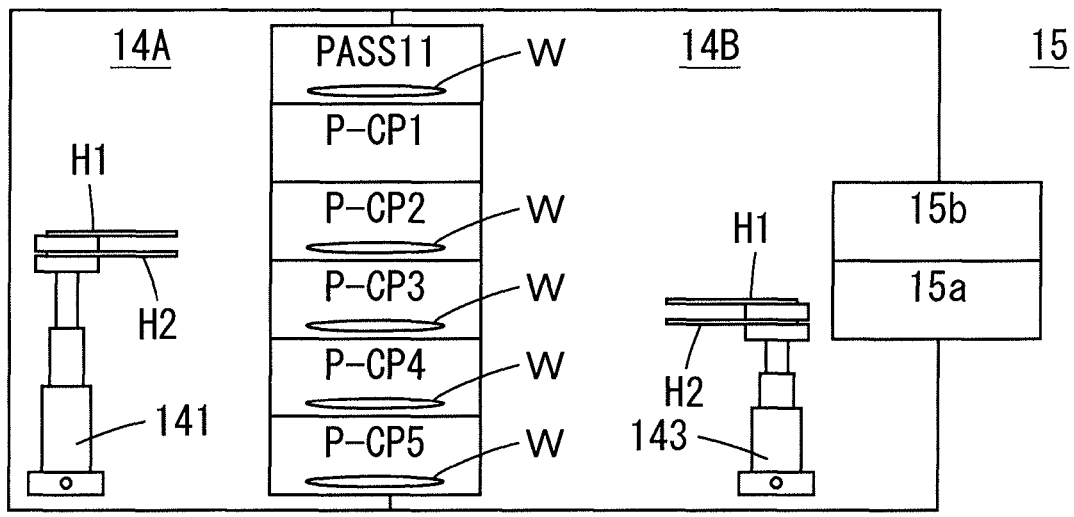

As shown in FIG. 10B, when the substrate W is transported from the cleaning drying processing block 14A to the carry-in carry-out block 14B for the fifth time, any of the placement cooling units P-CP2 to P-CP5 is used, and the placement cooling unit P-CP1 is not used. At this time, the placement cooling unit P-CP1 is used as a cooling buffer unit.

The above-mentioned operations are repeated, so that the respective placement cooling units P-CP1 to P-CP5 are used in order as the respective cooling buffer units. In this configuration, it is not necessary to provide a cooling buffer unit separately from the placement cooling units P-CP, and the cooling buffer unit can be realized by the same configuration as that of the placement cooling units P-CP. Thus, a manufacturing cost of the cooling buffer unit can be reduced. Further, all of the placement cooling units P-CP are sequentially used as the cooling buffer units, marked deterioration of only part of the placement cooling units P-CP over time is prevented.

Further, in the example of FIGS. 9A, 9B, 9C, 10A and 10B, the placement cooling unit P-CP that is used as the cooling buffer unit is changed every time one substrate W is transported from the cleaning drying processing block 14A to the carry-in carry-out block 14B. However, the present invention is not limited to this. For example, the placement cooling unit P-CP that is used as the cooling buffer unit may be changed every time the predetermined number of the substrates W are transported from the cleaning drying processing block 14A to the carry-in carry-out block 14B. Alternatively, the placement cooling unit P-CP that is used as the cooling buffer unit may be changed every predetermined time period.

(11) Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiment, the exposure device 15 is an example of an exposure device, the substrate processing apparatus 100 is an example of a substrate processing apparatus, and the coating processing unit 129 is an example of a coating device. The coating block 12 and the development block 13 are examples of a processing section, the substrate W is an example of a substrate, the interface block 14 is an example of a receiving transferring section, and the local controller 400 is an example of a substrate transport controller. The transport devices 141, 142 are examples of a first transport device, the transport device 143 is an example of a second transport device, the placement cooling unit P-CP is an example of a placement cooler, and the cooling buffer unit C-BF is an example of a temperature maintainer.

The transport controllers 410, 420, 430, 440 are respectively examples of first to fourth transport controllers, the determiner 450 is an example of a determiner, the sending buffer units SBF1, SBF2 are examples of a buffer, and the substrate platform PASS11 is an example of a returning platform. The hands H1, H2 of the transport devices 141, 142 are respectively examples of first and second holders, the hands H1, H2 of the transport device 143 are respectively examples of third and fourth holders, and the hands H1, H2 of the transport device 143 are respectively examples of fifth and sixth holders.

As each of constituent elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

INDUSTRIAL APPLICABILITY

The present invention can be effectively utilized for processing with use of an exposure device for various types of substrates.

We claim:

1. A substrate processing apparatus that is arranged to be adjacent to an exposure device, comprising:
a processing section including a coating device that applies a photosensitive material on a substrate and forms a photosensitive film;
a receiving transferring section for receiving and transferring the substrate between the processing section and the exposure device; and
a CPU that controls transport of the substrate, wherein the receiving transferring section includes
first and second transport devices that hold and transport the substrates,
a placement cooler configured for receiving the substrate on the placement cooler, the placement cooler being for cooling the placed substrate, and
a temperature maintainer configured for receiving the substrate on the temperature maintainer, the temperature maintainer being for maintaining a temperature of the placed substrate,
the CPU is programmed to
control the first transport device such that the substrate is carried onto the placement cooler from the processing section, and control the second transport device such that the substrate placed on the placement cooler is carried out,
determine whether the exposure device is able to receive the substrate,
when the exposure device is determined to be able to receive the substrate, control the second transport device such that the substrate that has been carried out from the placement cooler is transported to the exposure device, and
when the exposure device is determined to be unable to receive the substrate, control the second transport device such that the substrate that has been carried out from the placement cooler is carried into the temperature maintainer, and after it is determined that the exposure device is able to receive the substrate, control the second transport device such that the substrate is carried out from the temperature maintainer and transported to the exposure device,
wherein the receiving transferring section includes a plurality of the placement coolers, and
the CPU is further programmed to control the first and second transport devices such that part of the plurality of the placement coolers functions as the temperature maintainer and does not function as the placement cooler.

2. The substrate processing apparatus according to claim 1, wherein
the CPU is further programmed to include
a first transport controller that controls the first transport device such that the substrate transported from the processing section is transported to the placement cooler,
a second transport controller that controls the second transport device such that the substrate placed on the placement cooler is carried out,
a third transport controller that, when it is determined that the exposure device is able to receive the substrate, controls the second transport device such that the substrate that has been carried out from the placement cooler is transported to the exposure device, and
a fourth transport controller that, when it is determined that the exposure device is unable to receive the substrate, controls the second transport device such that the substrate that has been carried out from the placement cooler is carried into the temperature maintainer, and after it is determined that the exposure device is able to receive the substrate, controls the second transport device such that the substrate is carried out from the temperature maintainer and transported to the exposure device.

3. The substrate processing apparatus according to claim 1, wherein
the CPU is further programmed to control the first and second transport devices such that the part of the plurality of placement coolers that functions as the temperature maintainer is sequentially changed.

4. The substrate processing apparatus according to claim 1, wherein
the receiving transferring section further includes a buffer for temporarily storing the substrate, and
the CPU is further programmed to further control the first transport device such that, when the placement cooler is unable to receive the substrate, the substrate that has been processed in the processing section is transported to the buffer, and further control the first transport device such that, after the placement cooler becomes able to receive the substrate, the substrate stored in the buffer is transported to the placement cooler.

5. The substrate processing apparatus according to claim 1, wherein
the receiving transferring section further includes a returning platform on which the substrate can be placed, and
the CPU is further programmed to further control the first transport device such that the exposed substrate that is placed on the returning platform is carried out and transported, and further control the second transport device such that the exposed substrate is carried out from the exposure device and transported to the returning platform.

6. The substrate processing apparatus according to claim 5, wherein
the first transport device has first and second holders for holding the substrates, and
the CPU is further programmed to control the first and second holders of the first transport device such that carrying of the substrate out from the returning platform and carrying of the substrate into the placement cooler are performed continuously or concurrently.

7. The substrate processing apparatus according to claim 5, wherein
the second transport device has third and fourth holders for holding the substrates, and
the CPU is further programmed to control the third and fourth holders of the second transport device such that carrying of the substrate out from the exposure device and carrying of the substrate into the exposure device are performed continuously or concurrently.

8. The substrate processing apparatus according to claim 5, wherein
the second transport device has fifth and sixth holders for holding the substrates, and
the CPU is further programmed to further control the fifth and sixth holders of the second transport device such that carrying of the substrate out from the placement cooler and carrying of the substrate into the returning platform are performed continuously or concurrently.

* * * * *